(12) United States Patent
Ahn

(10) Patent No.: US 8,106,421 B2
(45) Date of Patent: Jan. 31, 2012

(54) PHOTOVOLTAIC DEVICES

(75) Inventor: Doyeol Ahn, Seoul (KR)

(73) Assignee: University of Seoul Industry Cooperation Foundation, Seoul (KR)

( * ) Notice: Subject to any disclaimer, the term of this patent is extended or adjusted under 35 U.S.C. 154(b) by 123 days.

(21) Appl. No.: 12/545,713

(22) Filed: Aug. 21, 2009

(65) Prior Publication Data

US 2011/0042721 A1    Feb. 24, 2011

(51) Int. Cl.
*H01L 31/102* (2006.01)
(52) U.S. Cl. ...................................................... 257/184
(58) Field of Classification Search .................. 257/438, 257/184
See application file for complete search history.

(56) References Cited

U.S. PATENT DOCUMENTS

| | | | |
|---|---|---|---|
| 6,441,298 | B1 | 8/2002 | Thio |
| 7,663,138 | B2 | 2/2010 | Fujikura |
| 2002/0179923 | A1 | 12/2002 | Morita et al. |
| 2003/0168653 | A1* | 9/2003 | Tsujimura et al. ............. 257/14 |
| 2004/0072383 | A1 | 4/2004 | Nagahama et al. |
| 2004/0095978 | A1* | 5/2004 | Cheng et al. .................. 372/45 |
| 2005/0242364 | A1 | 11/2005 | Moustakas et al. |
| 2006/0284200 | A1* | 12/2006 | Coffa et al. ................... 257/98 |
| 2008/0029758 | A1* | 2/2008 | Kozaki ........................... 257/14 |

OTHER PUBLICATIONS

Australian Patent Office, International Search Report & Written Opinion in related PCT application No. PCT/KR2010/005601; mailed Nov. 2, 2010.
Sang-Kyun Kim, et al "The effect of localized surface plasmon on the photocurrent of silicon nanocrystal photodetectors" Applied Physics Letters 94, 183108 (2009).
E. T. Yu, et al "Plasmonic nanoparticle scattering for enhanced performance of photovoltaic and photodetector devices" Plasmonics: Nanoimaging, Nanofabrication and Their Applications IV, edited by Satoshi Kawata, Vladimir M. Shalaev, Din Ping Tsai, Proc. of SPIE vol. 7033, 70331V, (2008).
Seoung-Hwan Park, et al "Crystal-orientation effects on the piezoelectric field and electronic properties of strained wurtzite semiconductors" Physical Review B, vol. 59, No. 7, Feb. 15, 1991-I; pp. 4725-4737.
Seoung-Hwan Park "Crystal Orientation Effects on Electronic Properties of Wurtzite GaN/AlGaN Quantum WElls with Spontaneous and Poezoelectric Polarization" Jpn. J. Appl. Phys. vol. 39 Part 1, No. 6A, Jun. 2000 pp. 3478-3482.
P. Waltereit, et al "Nitride semiconductors free of electrostatic fields for efficient white light-emitting diodes" Letters to Nature, vol. 406, Aug. 24, 2000 pp. 865-868.
Seoung-Hwan Park, et al "Optical gain in InGaN/InGaAlN quantum well structures with zero internal field" Applied Physics Letters 92, 171115 (2008).
Koichi Okamoto, et al "Surface-plasmon-enhanced light emitters based on InGaN quantum wells" Nature Materials, vol. 3, Sep. 2004, pp. 601-605.
Arup Neogi, et al "Enhancement of spontaneous recombination rate in a quantum well by resonant surface plasmon coupling" Pysical Review B 66, 153305 (2002). Sergey I. Bozhevolnyi, et al "Channel Plasmon-Polariton Guiding by Subwavelength metal Grooves" Physical Review Letters, PRL 95, 046802 (2005) week ending Jul. 22, 2005.
Liu Liu, et al "Novel surface plasmon waveguide for high integration" Optics Express, vol. 13, No. 17. Aug. 22, 2005, pp. 6645-6650.
K. Leosson, et al "Long-range surface plasmon polariton nanowire waveguides for device applications" Optics Express, vol. 14, No. 1, Jan. 9, 2006, pp. 314-319.

* cited by examiner

*Primary Examiner* — N Drew Richards
*Assistant Examiner* — Harunur Rashid
(74) *Attorney, Agent, or Firm* — Maschoff Gilmore & Israelsen

(57) ABSTRACT

Implementations of quantum well photovoltaic devices are provided. In one embodiment, a photovoltaic device includes an active layer that includes a first barrier layer, a well layer located on the first barrier layer and made of a nitride semiconductor, and a second barrier layer located on the well layer. A metal layer is located adjacent to the active layer.

11 Claims, 9 Drawing Sheets

PHOTOVOLTAIC DEVICES

CROSS REFERENCE TO RELATED APPLICATION

This application is related to U.S. patent application Ser. No. 12/192,025 filed Aug. 14, 2008.

BACKGROUND

Photovoltaic devices (or photosensors) are capable of detecting light or other electromagnetic energy, which is accomplished by utilizing the interband transition of electrons in a quantum well to detect or absorb an energy level of a photon. A quantum well has energy bands and when an electron in the quantum well is excited by a photon, the electron jumps to a higher energy band according to the energy level of the photon. When an energy level of a photon is greater than the gap between the bands energy levels and the photon enters a quantum well of a photovoltaic device, the electrons in the quantum well become excited and move to an upper band. In some cases, this movement of excited electrons to the upper band is described as "tunneling the barrier." Such electron transition causes an electric current through the photovoltaic device.

As nano-photonic devices are increasingly used in various applications (e.g., compact digital cameras), photovoltaic devices for those applications have become smaller than the wavelength of the light to be detected. In this case, the detection efficiency drops very rapidly because the dielectric waveguide structure is inefficient in the sub-wavelength region.

SUMMARY

Various embodiments of photovoltaic devices capable of detecting a photon are disclosed. In one embodiment, by way of a non-limiting example, a photovoltaic device includes an active layer having a first barrier layer, a well layer located on the first barrier layer and made of a nitride semiconductor, and a second barrier layer located on the well layer. A metal layer is located adjacent to the active layer.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
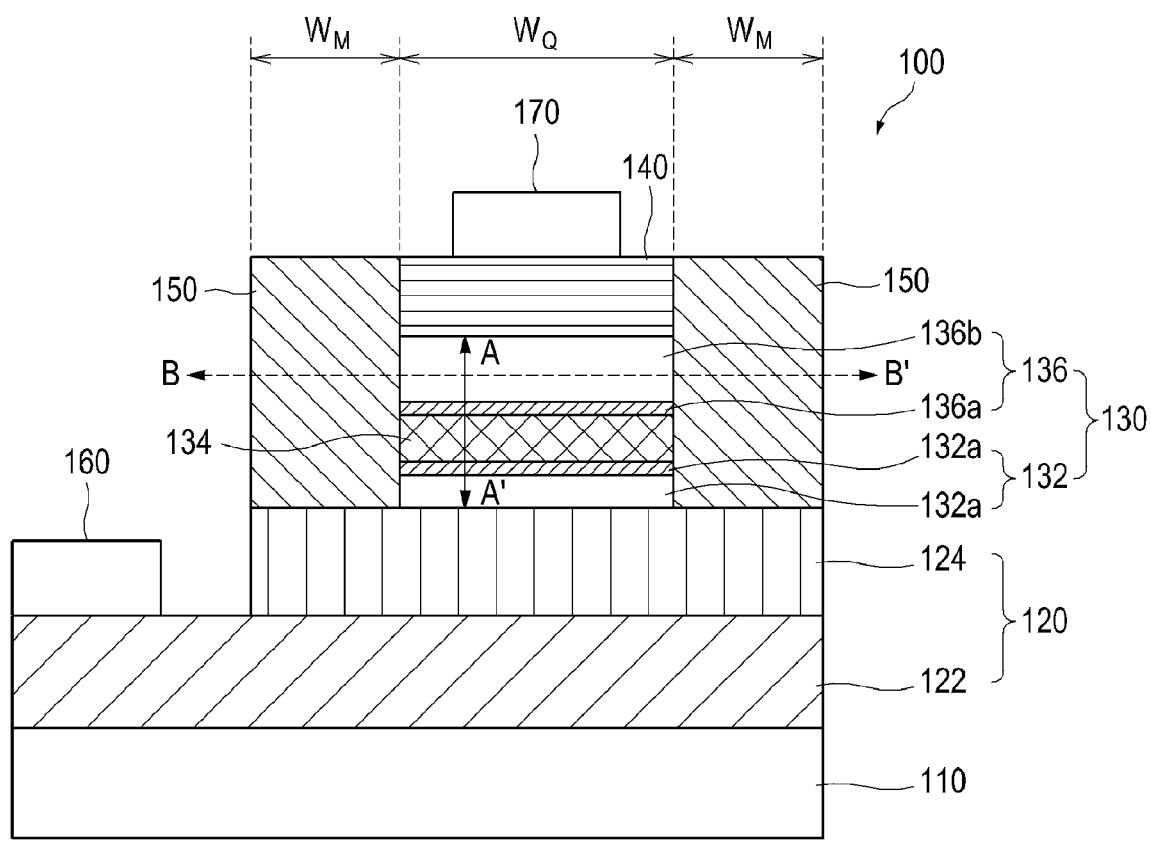
FIG. 1 shows a schematic diagram of an illustrative embodiment of a photovoltaic device.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the Figures, can be arranged, substituted, combined, and designed in a wide variety of different configurations, all of which are explicitly contemplated herein.

FIG. 1 shows a schematic diagram of an illustrative embodiment of a photovoltaic device 100. As depicted, photovoltaic device 100 may include a substrate 110, a first doped layer 120, an active layer 130, a second doped layer 140, a metal layer 150, a first electrode 160 and a second electrode 170.

Substrate 110 facilitates the growing of other layers thereon (e.g., first doped layer 120, active layer 130 and second doped layer 140) in the process of fabricating photovoltaic device 100. In one embodiment, substrate 110 may include sapphire, SiC or glass, etc.

As depicted in FIG. 1, first doped layer 120 provides carriers such as electrons or holes to active layer 130. In one embodiment, first doped layer 120 may include n-type semiconductor materials to provide electrons. To form first doped layer 120, an n-type impurity such as Si, Ge, Sn or Te may be doped on an intrinsic layer such as ZnS or ZnO.

In one embodiment, first doped layer 120 may include a highly doped layer 122 and a normally doped layer 124 as shown in FIG. 1. Highly doped layer 122 may provide more carriers and good ohmic characteristics while normally doped layer 124 may provide good crystal characteristics to enhance quantum efficiency in active layer 130. For example in one embodiment, highly doped layer 122 may have a resistivity ranging from about 0.01 ohm/cm to about 0.1 ohm/cm. Normally doped layer 124 may have, for example, a resistivity higher than about 600 ohm/cm.

Also, second doped layer 140 on active layer 130 may provide carriers such as electrons or holes to active layer 130. In another embodiment, second doped layer 140 may include p-type semiconductor materials to provide holes. To form second doped layer 140, a p-type impurity such as Zn, Mg, Ca or Be may be doped on an intrinsic layer such as ZnS. In one embodiment, second doped layer 140 may have a resistivity higher than about 600 ohm/cm. As shown in FIG. 1, metal layer 150 also may be formed laterally adjacent to second doped layer 140 and formed on first doped layer 120.

The types of first and second doped layers 120, 140 may be varied. By way of example, but not limitation, first doped layer 120 may be doped with a p-type impurity, and second doped layer 140 doped with an n-type impurity. In other embodiments, first doped layer 120 may be doped with an n-type impurity, and second doped layer 140 doped with a p-type impurity Active layer 130 formed on first doped layer 120 may be configured to absorb a predetermined energy range of a photon. As depicted in FIG. 1, active layer 130 may include a first barrier layer 132, a second barrier layer 136, and a well layer 134 interposed between first barrier layer 132 and second barrier layer 136.

Barrier layers 132 and 136 may be configured to have an energy band so that carriers such as electrons or holes may be confined in well layer 134. When a photon with a predetermined energy range enters well layer 134, electrons or holes confined in well layer 134 may absorb the energy of the photon and tunnel through barrier layers 132, 136 to produce an electric current.

As depicted in FIG. 1, first barrier layer 132 may include a first sub barrier layer 132a and a first primary barrier layer 132b. Similarly, second barrier layer 136 may include a second sub barrier layer 136a and a second primary barrier layer 136b. Sub barrier layers 132a, 136a may reduce strain and/or built-in fields in well layer 134. An explanation of the principle of reducing strain and/or built-in fields in well layer 134 is provided in detail below.

Total polarization field $P_t$ (built-in field) in well layer 134 is provided as a sum of spontaneous polarization field $P_{sp}$ and a piezo field $P_z$, as shown in Equation 1 below:

$$P_t = P_{sp} + P_z \quad \text{[Equation 1]}$$

where spontaneous polarization field $P_{sp}$ may be obtained by using experimental values known in the art, as described in Bernardini and Fiorentini, "Nonlinear Macroscopic Polarization in III-V Nitride Alloys," Physical Review B, 64:085207 (2001). Piezo electric fields $P_z$ is strain in well layer 134 caused by lattice mismatch between other layers such as first barrier layer 132 or second barrier layer 136, and may be calculated using Equation 2 below:

$$P_z = 2d_{31}\left(c_{11} + c_{12} - \frac{2c_{13}^2}{c_{33}}\right)\varepsilon_{xx} \quad \text{[Equation 2]}$$

where $d_{31}$ is a piezoelectric constant, $c_{11}$, $c_{12}$, $c_{13}$, and $c_{33}$ are elastic stiffness constants of well layer 134, and $\varepsilon_{xx}$ is effective strain in well layer 134 that may be represented by Equation 3 below:

$$\varepsilon_{xx} = \frac{F}{Ed} + \frac{d}{2R} \quad \text{[Equation 3]}$$

where d is the thickness of well layer 134, E is the Young's modulus of well layer 134, R is the relative Young's modulus value of well layer 134 that may be represented by Equation 4 below and F is force per unit length of well layer 134 that may be represented by Equation 5 below:

$$\frac{1}{R} = \frac{R_3}{R_1 + R_2} \quad \text{[Equation 4]}$$

$$\text{where } R_1 = \left(\sum_i E_i d_i^3\right);$$

$$R_2 = 3\sum_i \frac{E_i d_i}{a_i}\left(d_i + 2\sum_{j<i} d_j\right) \times \left[\sum_j \left(\frac{E_j d_j}{a_j}\right)\left\{2\sum_{k<i} a_k d_k - 2\sum_{k<j} a_k d_k + a_i d_i - a_j d_j\right\}\right]$$

$$R_3 = 6\sum_i \frac{E_i d_i}{a_i}\left(d_i + 2\sum_{j<i} d_j\right)\left(\sum_j \left(\frac{E_j d_j}{a_j}\right)(l_i - l_j)\right)$$

$$F = \frac{E_i d_i}{a_i \sum_j (E_j d_j / a_j)} \times \left[\frac{1}{R}\sum_j \left(\frac{E_j d_j}{a_j}\right)\left\{\sum_{k<i} a_k d_k - \sum_{k<j} a_k d_k + \frac{a_i d_i - a_j d_j}{2}\right\} + \sum_j \left(\frac{E_j d_j}{a_j}\right)(l_j - l_i)\right] \quad \text{[Equation 5]}$$

where $d_i$ is the thickness of the i-th layer in photovoltaic device 100, $E_i$ is the Young's modulus of the i-th layer, $a_i$ is a lattice constant and $l_i = a_i(1 + \alpha_i T)$, where $\alpha_i$ is a heat expansion constant and T is the absolute temperature.

As can be seen from the above equations, coefficients and/or constants in the equations relate to the characteristics and/or concentrations of materials included in well layer 134 and layers 132, 136 adjacent thereto. For example, first sub barrier layer 132a and/or second sub barrier layer 136a may include materials that reduce lattice differences between well layer 134 and overall barrier layers 132, 136. Further, the materials included in first sub barrier layer 132a and/or second sub barrier layer 136a may have composition ratios comparable to those of the materials in well layer 134. This may reduce lattice differences between well layer 134 and overall barrier layers 132, 136. Alternatively, first barrier layer 132 and/or second barrier layer 136 may include a quaternary semiconductor. The concentration of each constituent of the quaternary semiconductor may be adjusted to reduce strain and/or the built-in field in well layer 134. The latter example is further explained below in reference to FIG. 4.

Well layer 134 may include materials exhibiting full-solar-spectrum characteristics, for example, absorbing a photon with a spectrum ranging from red to violet to produce an electric current. In some embodiments, well layer 134 may include a Group III-V semiconductor or a nitride semiconductor, e.g., a material consisting essentially of indium, gallium and nitrogen, represented by $In_xGa_{1-x}N$ ($x \leq 1$). In some embodiments, well layer 134 may include a silicon semiconductor. Indium concentration, x, in $In_xGa_{1-x}N$ may be varied depending on the type or characteristics of photovoltaic device 100, e.g., a light emitting diode (LED), a laser diode (LD), etc. For example, x may be in the range of about $0.34 \leq x \leq 0.47$ for visible blue light emission or about $0 \leq x \leq 0.19$ for ultraviolet light emission. In general, x may be in the range of about $0 \leq x \leq 0.5$ for a light emitting device.

Sub barrier layers 132a, 136a may include a material similar to that of well layer 134, e.g., nitride semiconductor or silicon semiconductor, to reduce the lattice differences between well layer 134 and overall barrier layers 132, 136. For example, sub barrier layers 132a, 136a may include indium, gallium, or nitrogen, and have a composition represented by $In_yGa_{1-y}N$ ($y \leq 1$), when well layer 134 is formed of $In_xGa_{1-x}N$.

Primary barrier layers 132b, 136b may include materials in which electrons and/or holes in well layer 134 may not tunnel through barrier layers 132, 136. For example, primary barrier layers 132b, 136b may include gallium or nitrogen when well layer 134 and sub barrier layers 132a, 132b include indium, gallium, or nitrogen. Characteristics of each layer 132a, 132b, 136a, 136b in barrier layers 132, 136, such as compositions and their respective concentrations and thickness, etc., may be determined so that the strain and/or electric (polarization) field in well layer 134 due to the lattice mismatch may be cancelled or reduced.

When indium concentrations of sub barrier layers 132a, 136a are varied, changes in strain and polarization (built-in field) in well layer 134 and barrier layers 132, 136 may be calculated using the above equations. For example, assume that well layer 134 has a composition of $In_{0.2}Ga_{0.8}N$ and primary barrier layers 132b, 136b have GaN, respectively. Also assume that sub barrier layers 132a, 136a have the same thickness of about 4 nm. Table 1 below shows results of the calculation for the above three different cases, in view of Indium concentration y of sub barrier layers 132a, 136a. That is to say, the compositions of sub barrier layers 132a, 136a are GaN, $In_{0.025}Ga_{0.975}N$, and $In_{0.05}Ga_{0.95}N$, respectively. If sub barrier layers 132a, 136a include the same materials (such as GaN) as primary barrier layers 132b and 136b, the structure in some sense does not include a sub barrier layer since sub barrier layers 132a, 136a have the same composition as primary barrier layers 132b, 136b.

TABLE 1

|  | Indium concentration y (%) | | |
| --- | --- | --- | --- |
|  | 0 | 2.5 | 5 |
| Strain in well layer (%) | −2.09 | −2.035 | −1.984 |
| Strain in barrier layer (%) | 0.14 | −0.09 | −0.321 |
| Polarization field in well layer (MV/cm) | 3.01 | 2.909 | 2.83 |
| Polarization field in barrier layer (MV/cm) | −0.22 | 0.19 | 0.58 |

As indicated in Table 1 above, well layer 134 where y=0% has a strain of −2.09% and a polarization field of 3.01 MV/cm. When y=2.5% and 5%, well layer 134 has strains of −2.035% and −1.984% and polarization fields of 2.909 MV/cm and 2.83 MV/cm, respectively These results may indicate that well layer 134 has a strain reduced by 2.63%-5.07% and polarization field reduced by 3.36%-5.98% compared to a structure without sub barrier layers 132a, 136a. That is, as the indium concentrations of sub barrier layers 132a, 136a increase, strain and the polarization field in well layer 134 may decrease. Accordingly, in some embodiments when well layer 134 includes indium, increasing indium concentration in sub barrier layers 132a, 136a may reduce strain and/or the polarization field in well layer 134. Since indium at the present time is relatively rare and costly, however, a tradeoff may be made between performance and associated costs. For example, in order to obtain reasonably good performance, the indium concentration, y, in sub barrier layers 132a, 136a having a composition of $In_yGa_{1-y}N$ may be adjusted to have a range of about $0 \leq y \leq 0.3$, when well layer 134 has a composition of $In_xGa_{1-x}N$ where $0 \leq x \leq 0.3$.

Similarly, strain and the polarization field in well layer 134 and sub barrier layers 132a, 136a may also be calculated, as the thicknesses of sub barrier layers 132a, 136a are varied. For example, assume that well layer 134, sub barrier layers 132a, 136a, and primary barrier layers 132b, 136b have compositions of $In_{0.2}Ga_{0.8}N$, $In_{0.025}Ga_{0.975}N$, and GaN, respectively. Table 2 below shows results of the calculation for sub barrier layers 132a, 136a having the same thicknesses of about 2 nm, 4 nm, and 6 nm.

TABLE 2

|  | Thickness (nm) | | |
| --- | --- | --- | --- |
|  | 2 | 4 | 6 |
| Strain in well layer (%) | −2.06 | −2.035 | −2.001 |
| Strain in barrier layers (%) | −0.117 | −0.09 | −0.06 |
| Polarization field in well layer (MV/cm) | 2.946 | 2.909 | 2.87 |
| Polarization field in barrier layers (MV/cm) | 0.237 | 0.19 | 0.142 |

As indicated in Table 2 above, well layer 134 with sub barrier layers 132a, 136a having thicknesses of about 2 nm, 4 nm, and 6 nm has strains of −2.06%, −2.035%, and −2.001%, respectively, and polarization fields of −0.117, −0.09, and −0.06 MV/cm, respectively. Results may show that strain and the polarization field in well layer 134 decreases as thicknesses of sub barrier layers 132a, 136a are increased. Accordingly, the increasing thickness of sub barrier layers 132a, 136a may reduce strain and/or the polarization field in well layer 134. Due to size limits, however, a tradeoff may be made between the performance and the associated size. For example, in order to obtain reasonably good performance, the thickness of sub barrier layers 132a, 136a may be about 6 nm or less, when the thickness of well layer 134 is about 3 nm or less.

Well layer 134 may have a thickness of several nanometers. In some embodiments, the thickness of well layer 134 may be less than about 10 nm or less than about 3 nm. In other embodiments, the thickness of well layer 134 may range from about 1 nm to about 10 nm, from about 2 nm to about 8 nm, or from about 3 nm to about 6 nm. Barrier layers 132, 136 may have a thickness based on the thickness of well layer 134. In one embodiment, the thickness of barrier layers 132, 136 may have a range similar to that of well layer 134. In another embodiment, the thickness of barrier layers 132, 136 may be larger than that of well layer 134 by about 5 nm or less.

Tables 1 and 2 above merely represent certain illustrative embodiments where concentrations and thicknesses of sub barrier layers 132a, 136a may be varied, but are not to be considered as limiting the scope of the disclosure. The materials constituting first and second barrier layers 132a, 136a may also be changed. Further, concentrations, thicknesses, and materials for primary barrier layers 132b, 136b may also be changed to depolarize built-in electric fields in well layer 134, similar to sub barrier layers 132a, 136a.

Active layer 130 may have a predetermined width $W_Q$ depending on the usage of photovoltaic device 100. In one embodiment, predetermined width $W_Q$ of active layer 130 may be several hundred nanometers. For example, width $W_Q$ may range from about 10 nm to about 1000 nm, from about 10 nm to about 500 nm, or from about 10 nm to about 100 nm.

Referring again to FIG. 1, metal layer 150 is disposed laterally adjacent to active layer 130. Metal layer 150 may serve as a surface plasmon waveguide and concentrate an electric field and/or optical field in active layer 130. In one embodiment, metal layer 150 may include a metal material with a permittivity larger than permittivity of active layer 130. The relationship between electric fields formed in metal layer 150 and active layer 130 may be represented by Equation 6.

$$\frac{D_{x\_quantum}}{D_{x\_metal}} = \frac{\varepsilon_{quantum} E_{x\_quantum}}{\varepsilon_{metal} E_{x\_metal}} = 1 \quad \text{[Equation 6]}$$

$$\therefore \frac{E_{x\_quantum}}{E_{x\_metal}} = \frac{\varepsilon_{metal}}{\varepsilon_{quantum}}$$

where $D_x$ is electric displacement field along the x axis, $E_x$ is electric field intensity along the x axis, and $\varepsilon$ is permittivity.

According to Equation 6, the permittivity ratio of metal layer 150 to active layer 130 is greater than 1. Thus, a stronger electric field and/or optical field may be formed in active layer 130. The permittivity ratio of metal layer 150 to active layer 130 may range from about 2 nm to about 100 nm for a determined spectrum such as wavelengths ranging from the red to violet spectrum. In one embodiment, the type of metal material included in metal layer 150 may depend on the frequency of a target photon to be confined in active layer 130 because permittivity of a metal is varied depending on the frequency of the photon. For example, metal layer 150 may include one or compounds of Ag, Al, Au, Ni, Ti or any other metal.

As depicted in FIG. 1, metal layer 150 may have a predetermined width $W_M$ sufficient for concentrating the optical/electric field in active layer 130. For example, width $W_M$ may be in the range of several nanometers, several tens of nanometers, or several hundreds of nanometers. In one embodiment, width $W_M$ of metal layer 150 may range from about 10 nm to about 1000 nm, from about 10 nm to about 500 nm, or from about 10 nm to about 100 nm.

In some embodiments, substrate 110, first doped layer 120, active layer 130, and second doped layer 140 may be sequentially stacked. Layers 120, 132, 134, 136, 140 of photovoltaic device 100 may be grown using any one of a variety of well-known procedures including, but not limited to, molecular beam epitaxy (MBE), metalorganic chemical vapor deposition (MOCVD) or numerous other growth methods as appropriate.

Further, as depicted in FIG. 1, first electrode 160 may be disposed on first doped layer 120, and second electrode 170 may be deposed on second doped layer 140. Electrodes 160, 170 may provide power to photovoltaic device 100 from an external power source (not shown). In one embodiment, first electrode 160 may have a laminated structure of Ti/Al. While FIG. 1 illustrates an embodiment where parts of active layer 130 and second doped layer 140 have been removed to expose a part of first doped layer 120 to form first electrode 160 thereon, various other embodiments are possible. For example, substrate 110 may be removed and first electrode 160 may be formed beneath first doped layer 120.

In one embodiment, second electrode 170 may have a laminated structure of Ni/Au or Ag/Au. In another embodiment, second electrode 170 may include a transparent metal such as indium tin oxide (ITO) for allowing photons or other light particle to pass through second electrode 170.

Figure 2:
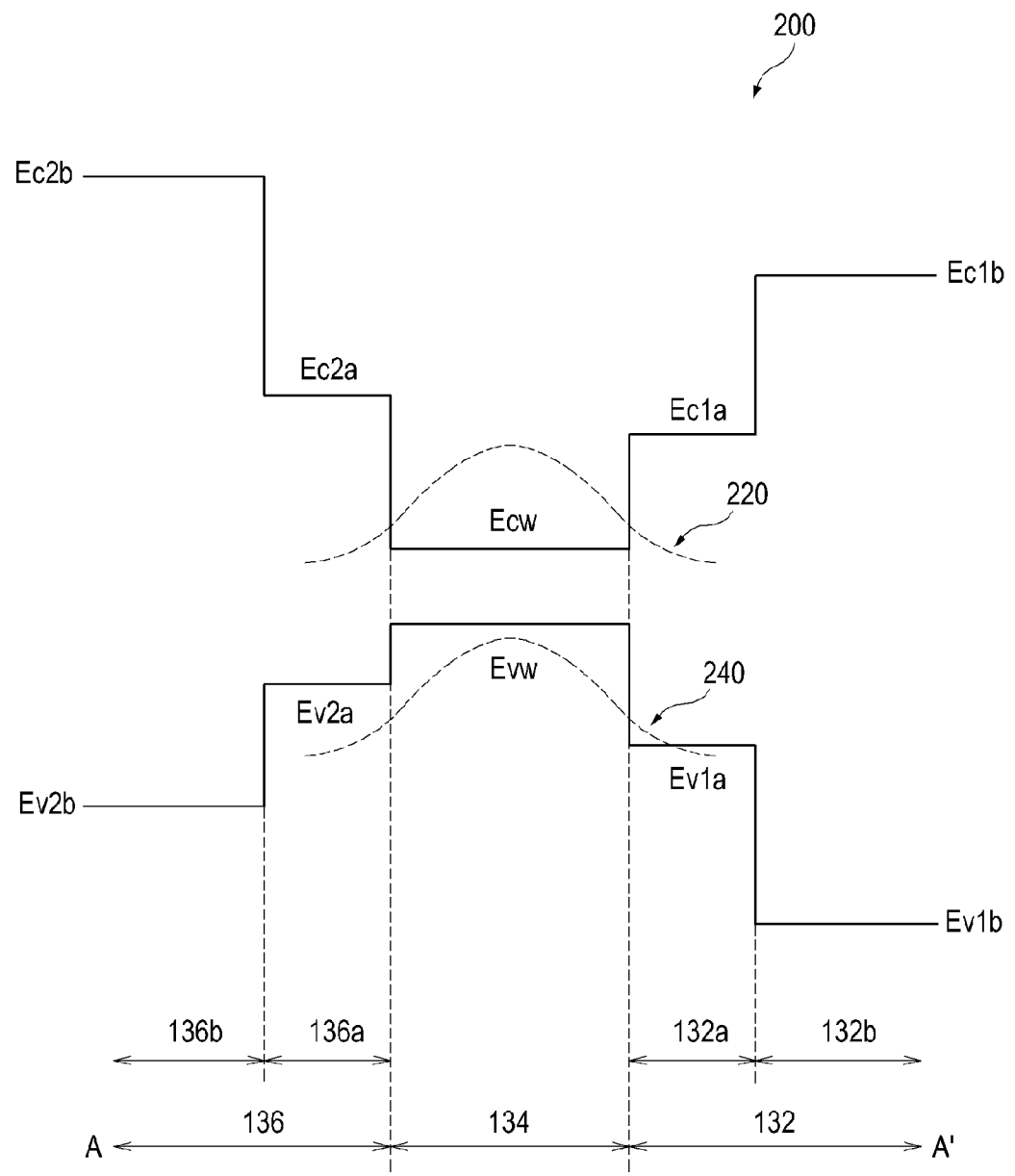
FIG. 2 shows an energy band diagram of a carrier wave along line A-A' shown in FIG. 1.

FIG. 2 is an energy band diagram showing carrier wave functions 220, 240 along line A-A' shown in FIG. 1. Lines in the horizontal direction represent regions of layers 132, 132a, 132b, 134, 136, 136a, 136b. Lines in the vertical direction represent energy bands of the regions.

Carrier wave functions 220, 240 represent the probability of the existence of electrons and holes, respectively. Carrier wave functions 220, 240 may be located near the center of well layer 134 and overlap at or near [please confirm that we can state "or near"] their maximum portions, as shown in FIG. 2. Thus, the concentration of electrons and holes are higher at or near the center of well layer 134. However, without sub barrier layers 132a, 136a, built-in electric field will be present in well layer 134. This is because a lattice mismatch between barrier layers 132, 136 and well layer 134 causes piezo effects, which in turn cause carrier wave functions (an electron wave function 220 and a hole wave function 240) to shift in opposite directions. Specifically, electron wave function 220 may be shifted in the direction of the electric field since the electric field attracts electrons, and hole wave function 240 may be shifted in the opposite direction of the electric field since the electric field pushes holes. As a result, the overlapping region of carrier wave functions 220, 240 decreases and the probability that electrons and holes meet to combine also decreases, thereby reducing quantum efficiency.

As illustrated in FIG. 2, second sub barrier layer 136a may be adjusted to reduce the difference in lattice constants between well layer 134 and second barrier layer 136. For example, valence band energy upper limits Ev2b, Ev2a, and Evw of second primary barrier layer 136b, second sub barrier layer 136a, and well layer 134 may satisfy the following relationship: $E_{v2b} < E_{v2a} < E_{vw}$. For example, conduction band energy lower limits Ec2b, Ec2a, and Ecw of second primary barrier layer 136b, second sub barrier layer 136a, and well layer 134 may satisfy the following relationship: $E_{c2b} > E_{c2a} > E_{vw}$. In this fashion, strain and/or the polarization field in well layer 134 may be cancelled or reduced. Similarly, strain and/or the polarization field in well layer 134 may be cancelled or reduced by a similar adjustment in first sub barrier layer 132a based on the relationship between energy band limits Ec1b, Ec1a, Ecw, Ev1b, Ev1a, and Evw.

Figure 3:
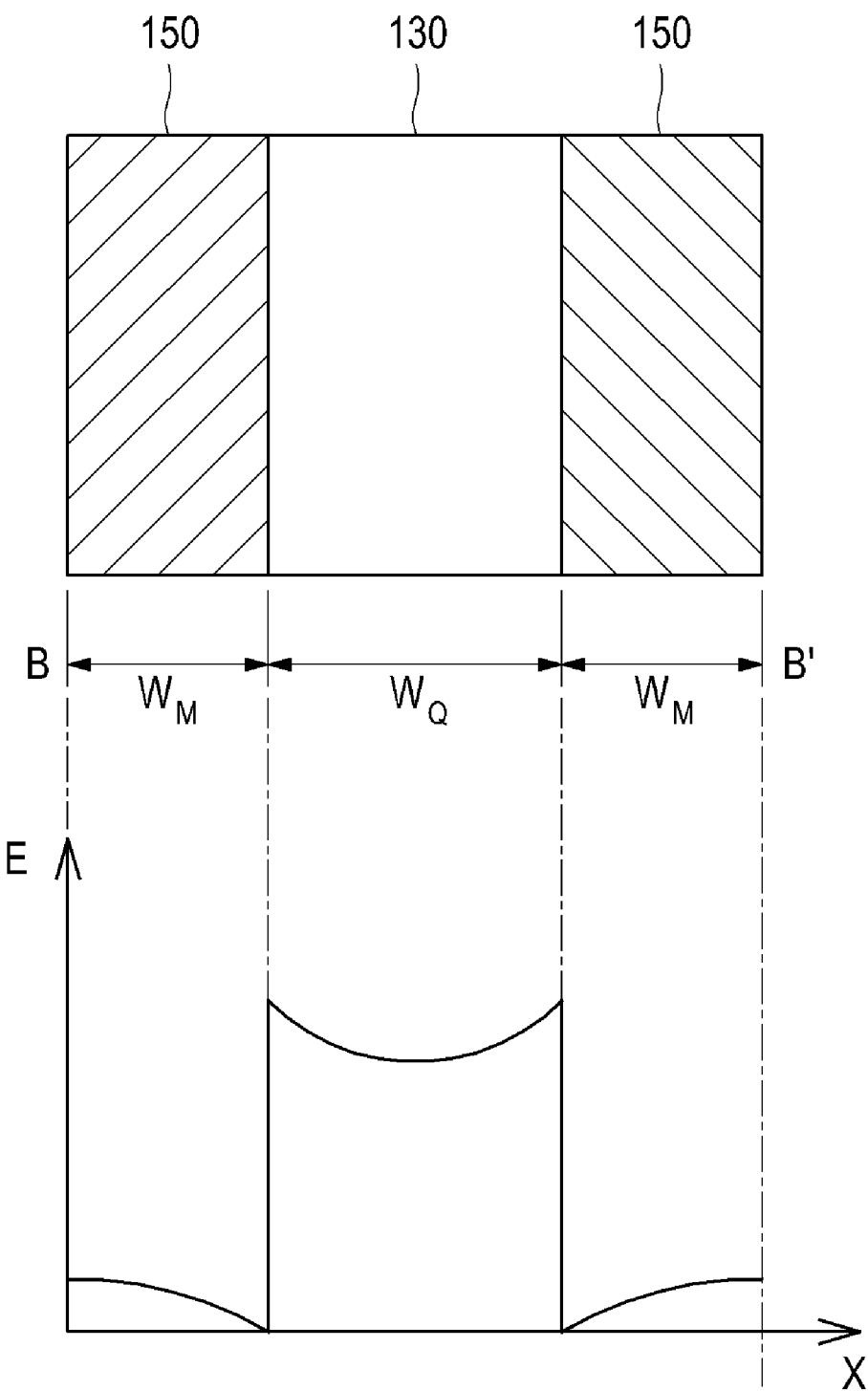
FIG. 3 shows a cross sectional diagram along line B-B' shown in FIG. 1 and a graph showing an electric/optical field formed therein.

FIG. 3 shows a cross sectional diagram of photovoltaic device 100 along line B-B' as shown in FIG. 1 and a graph showing an electric/optical field formed therein. Symbols E, X, $W_Q$ represent an electric and/or optical field formed in a corresponding region, a direction along the width of photovoltaic device 100, and a width of active layer 130, respectively. Same numeral references indicate same elements in FIG. 1. As shown in FIG. 2, an electric and/or optical field is concentrated on active layer 130 since the permittivity ratio of metal layer 150 and active layer 130 is greater than 1. Thus, unlike a conventional dielectric waveguide, an electric/optical field may not diffuse through the waveguide (metal layer 150) even if width $W_Q$ of active layer 130 decreases, e.g., down to several hundreds or several tens of nanometers. Therefore, quantum efficiency may not drop although photovoltaic device 100 may be smaller than the wavelength of a photon to be confined.

Figure 4:
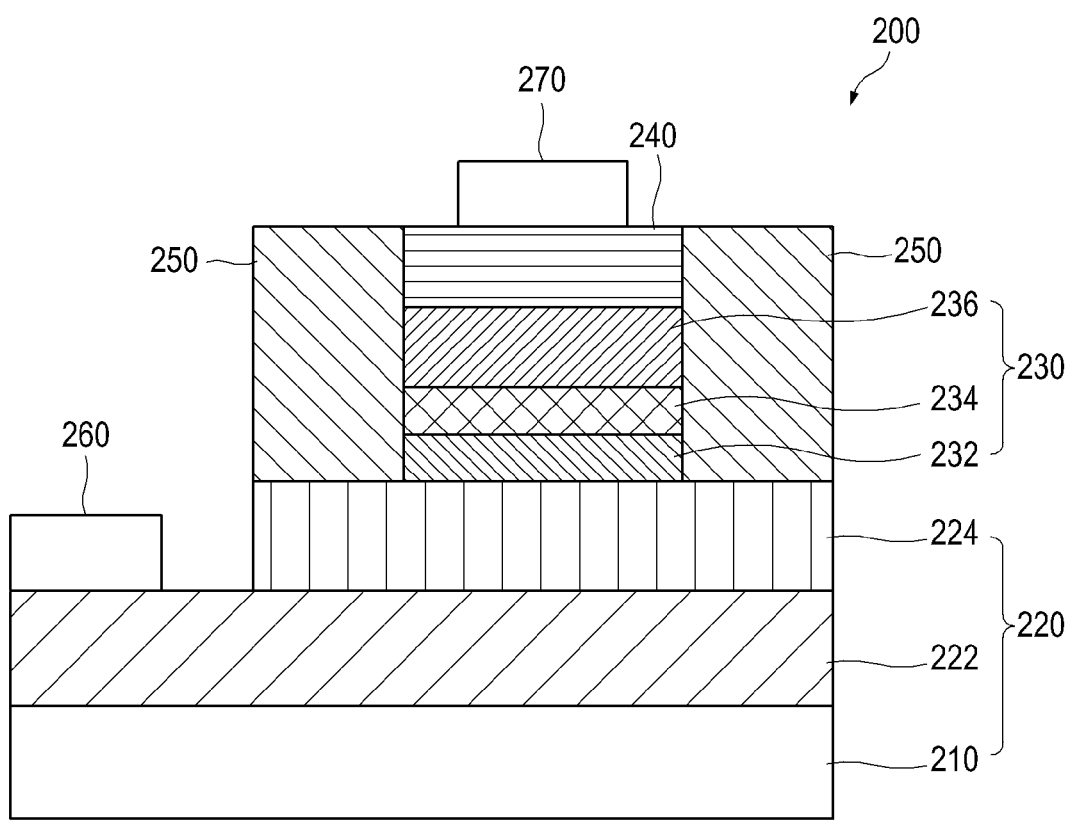
FIG. 4 shows a schematic diagram of another illustrative embodiment of a photovoltaic device.

FIG. 4 shows a schematic diagram of an illustrative embodiment of a photovoltaic device 200. As depicted, photovoltaic device 200 may have a structure similar to that of photovoltaic device 100 except for an active layer 230. Active layer 230 may include a first barrier layer 232, a second barrier layer 236, and a well layer 234 interposed between first barrier layer 232 and second barrier layer 236. In one embodiment, well layer 234 may have characteristics such as composition, width, thickness, etc, similar to those of well layer 134 as shown in FIG. 1.

Barrier layers 232, 236 may have a quaternary semiconductor to reduce strain and/or the built-in field in well layer 234 as explained above regarding Equation 5. In one embodiment, barrier layers 232, 236 may include constituents similar to those of well layer 234 to reduce the lattice differences between well layer 234 and barrier layers 232, 236. For example, barrier layers 232, 236, may include a quaternary nitride semiconductor composed of aluminum, indium, gallium, or nitrogen, and have a composition of $Al_zIn_yGa_{1-y-z}N$ (y, z≦1), when well layer 234 has a composition of $In_xGa_{1-x}N$. Characteristics of barrier layers 232, 236, such as compositions, their respective concentrations and thickness, etc. may be determined such that strain and/or the electric (polarization) field in well layer 234 due to lattice mismatch may be cancelled or reduced.

In one embodiment, layers 210, 220, 222, 224, 240, 250, 260, 270 in photovoltaic device 200 may have characteristics such as composition, width, thickness, etc, similar to those of layers 110, 120, 122, 124, 140, 150, 160, 170 in photovoltaic device 100.

Figure 5:
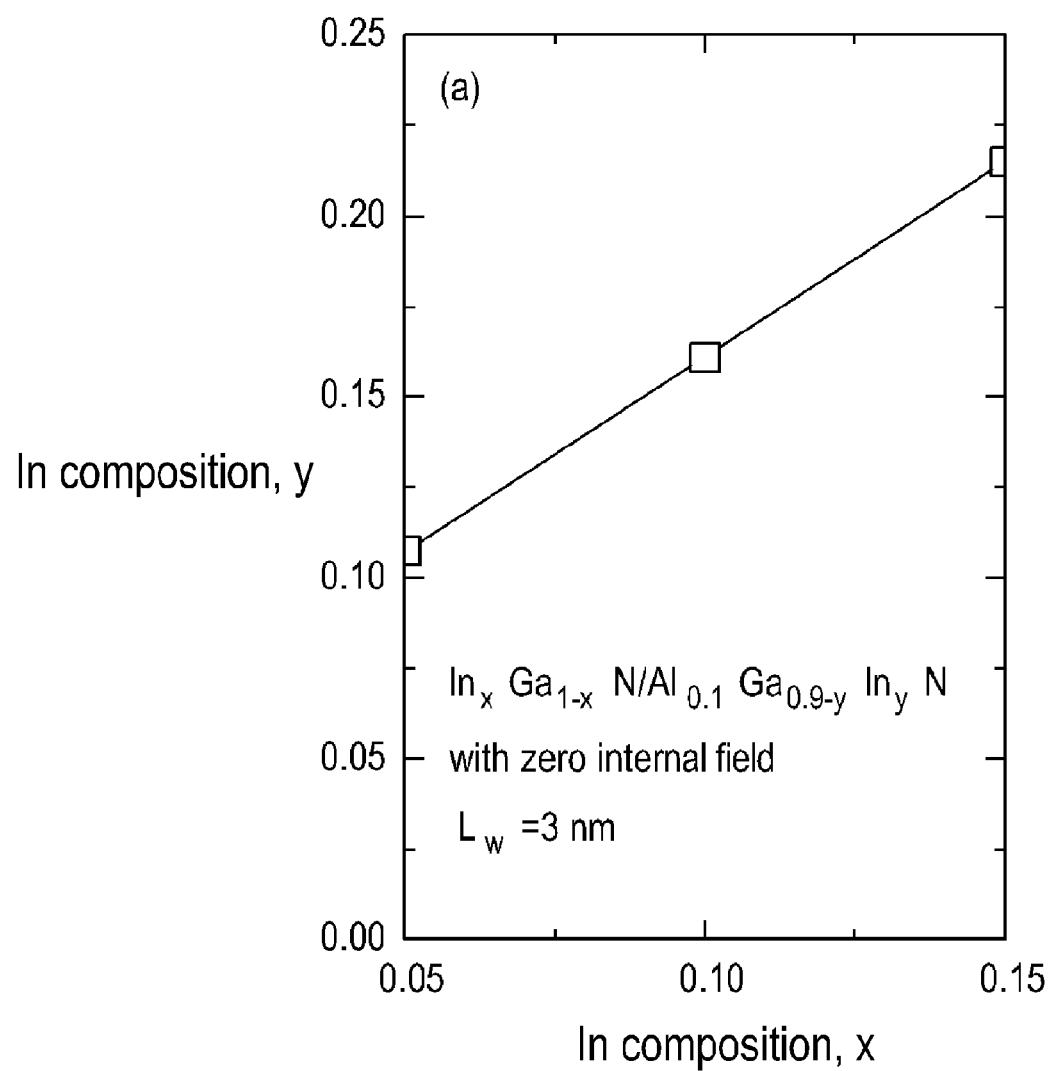
FIG. 5 shows a graph illustrating the proportional relationship between indium concentrations in the well layer and barrier layers, for the photovoltaic device shown in FIG. 4.

FIG. 5 shows an illustrative embodiment of the proportional relationship between indium concentrations in well layer 234 and barrier layers 232, 236 in accordance with the illustrative photovoltaic device 200 shown in FIG. 4. Symbols X, Y represent indium concentrations x in well layer 234, and an indium concentration y in barrier layers 232, 236, respectively. As depicted, as the indium concentration x of well layer 234 increases from about 0.05 to about 0.15, the indium concentration y of barrier layers 234, 236 may increase from about 0.10 to about 0.20. As depicted, the indium concentration of barrier layers 232, 236 may be increased, along with an increase in indium concentration of well layer 234 to cancel the internal field in well layer 234. For example, when the indium concentration x of well layer 234 has a range of about 0≦x≦0.3, the indium concentration y of barrier layers 232, 236 may have a range of about 0≦y≦0.3, and x and y have a relation of x≦y.

Figure 6:
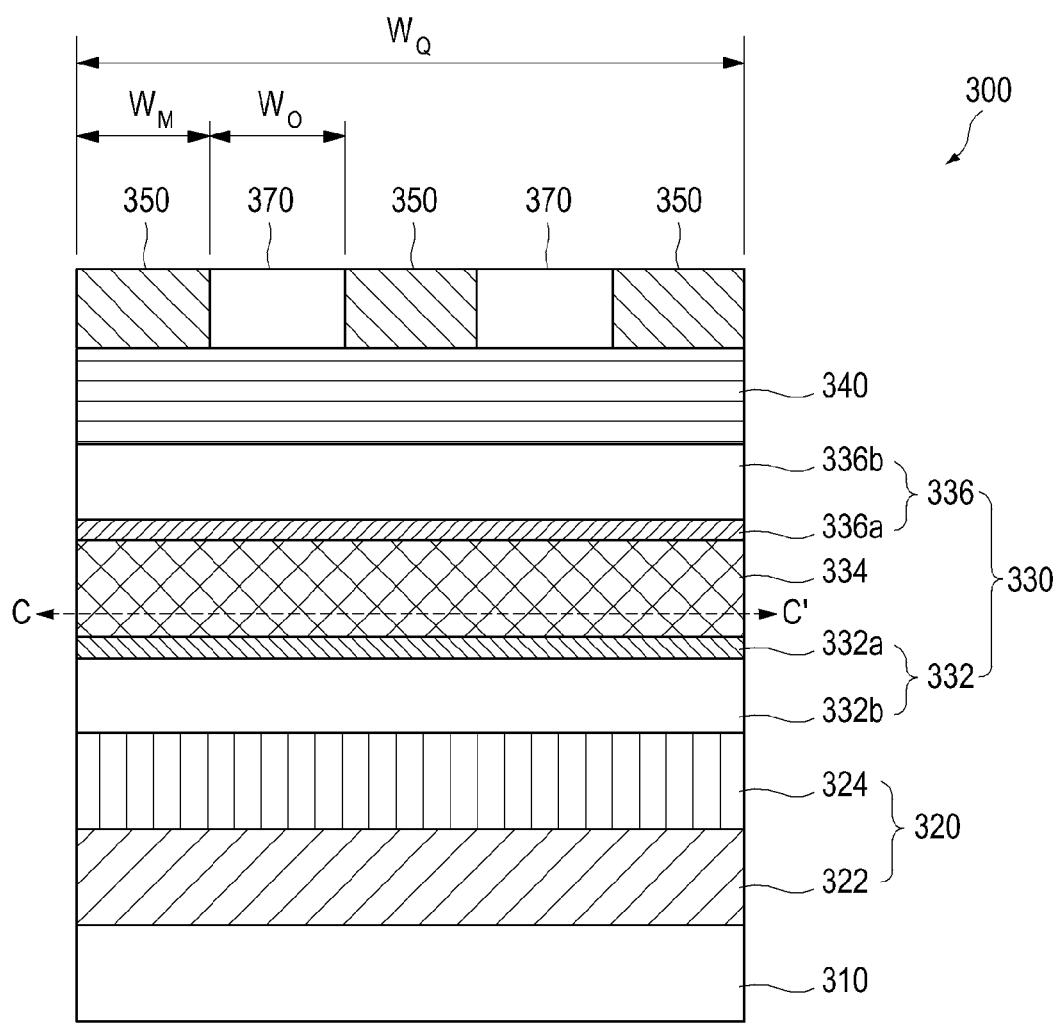
FIG. 6 shows a schematic diagram of still another illustrative embodiment of a photovoltaic device.

FIG. 6 shows a schematic diagram of an illustrative embodiment of a photovoltaic device 300. As depicted, photovoltaic device 300 may include a substrate 310, a first doped layer 320, an active layer 330, a second doped layer 340, a metal layer 350, and a second electrode 370.

As depicted in FIG. 6, first doped layer 320 may include a highly doped layer 322 and a normally doped layer 324 beneath active layer 330. In one embodiment, substrate 310 and doped layers 320, 340 may have characteristics such as composition, width, thickness, etc, similar to those of substrate 110 and doped layers 120, 140, respectively. In one embodiment, layers 320, 332, 334, 336, 340 in photovoltaic device 300 may be formed in a similar manner as layers 120, 132, 134, 136, 140 in photovoltaic device 100.

As depicted in FIG. 6, active layer 330 may include a first barrier layer 332, a second barrier layer 336, and a well layer 334 interposed between first barrier layer 332 and second barrier layer 336. First barrier layer 332 may include a first sub barrier layer 332a and a first primary barrier layer 332b. Similarly, second barrier layer 336 may include a second sub barrier layer 336a and a second primary barrier layer 336b. In one embodiment, active layer 330 may have characteristics such as composition, width, thickness, etc, similar to those of active layer 130 as shown in FIG. 1.

As shown in FIG. 6, metal layer 350 may be formed on active layer 330 and second doped layer 340. In one embodiment, metal layer 350 may include two or more metal strips to constitute a grating structure as shown in FIG. 6. In one embodiment, width $W_M$ of each metal strip and interval $W_D$ between adjacent metal strips may be determined based on width $W_Q$ of active layer 330.

For example, width $W_M$ may range from about 1 nm to about 200 nm, from about 1 nm to about 100 nm, or from about 1 nm to about 20 nm, corresponding to width $W_Q$ ranging from about 10 nm to about 1000 nm, from about 10 nm to about 500 nm, or from about 10 nm to about 100 nm. Similarly, interval $W_D$ may range from about 1 nm to about 600 nm, from about 1 nm to about 300 nm, or from about 1 nm to about 60 nm corresponding to the ranges of width $W_Q$ above.

In one embodiment, the type of metal material included in metal layer 350 may depend on the frequency of a target photon to be confined in active layer 330 because permittivity of a metal is varied depending on the frequency of the photon. For example, metal layer 350 may include one or compounds of Ag, Al, Au, Ni, Ti or any other metal.

In one embodiment, electrode 370 adjacent to metal layer 350 may include two or more electrode strips to constitute a grating structure as shown in FIG. 6. For example, each of the electrode strips may be formed between the metal strips. In one embodiment, electrode 370 may have characteristics such as composition, width, thickness, etc, similar to those of electrodes 170, as shown in FIG. 1.

Figure 7:
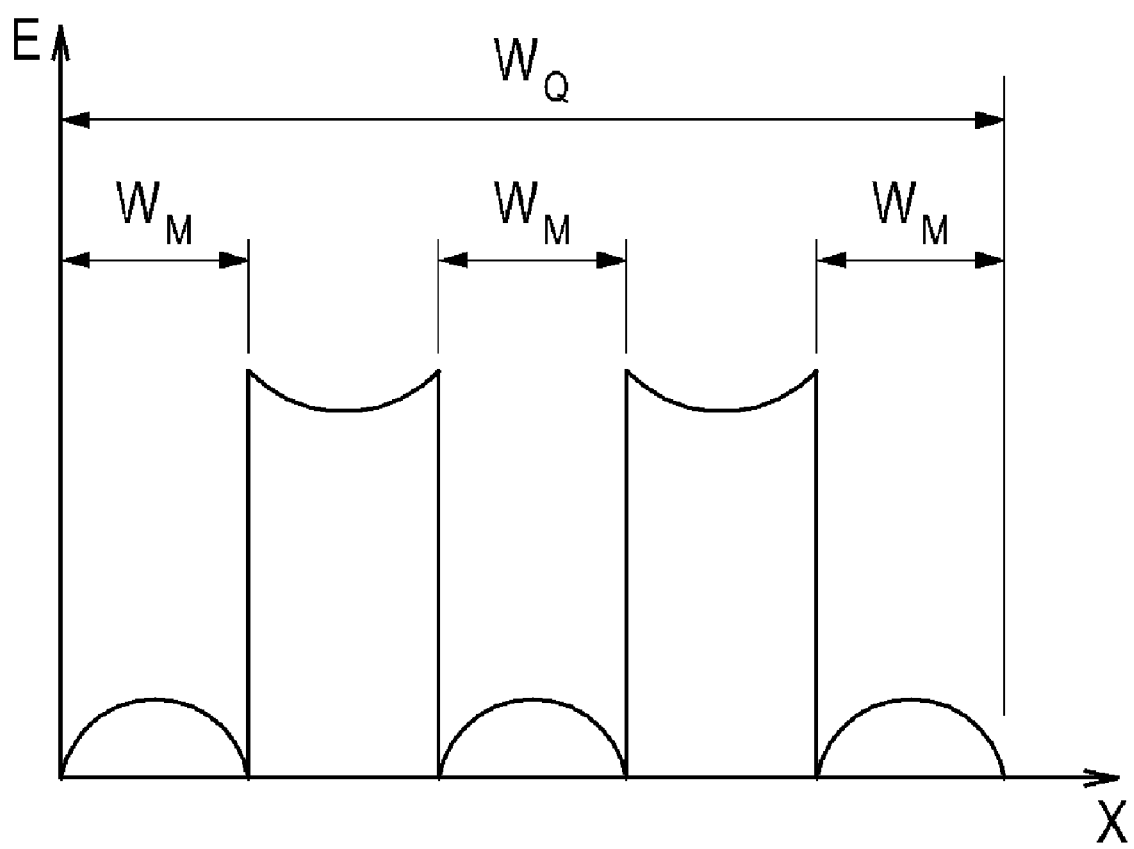
FIG. 7 shows a graph illustrating an electric/optical field formed in a cross sectional diagram along line C-C' shown in FIG. 6.

FIG. 7 shows a graph illustrating an electric/optical field formed in a cross section of photovoltaic device 300 along line C-C' as shown in FIG. 6. Symbols E, X, $W_M$, $W_D$, $W_Q$ represent an electric and/or optical field formed in a corresponding region, a direction along the width of photovoltaic device 300, and width of one metal strip, interval between adjacent metal strips, and width of active layer 330, respectively. As shown in FIG. 7, the electric and/or optical field is concentrated inside active layer 330, specifically portions which metal layer 350 is not located over since the permittivity ratio of metal layer 350 and active layer 330 is greater than 1. Thus, unlike conventional dielectric waveguides, the electric/optical field may not diffuse to the waveguide (metal layer 350) even if width $W_Q$ of active layer 330 decreases, e.g., down to several hundreds or several tens of nanometers. Therefore, quantum efficiency may not drop although photovoltaic device 300 may be smaller than the wavelength of a photon to be confined.

Figure 8:
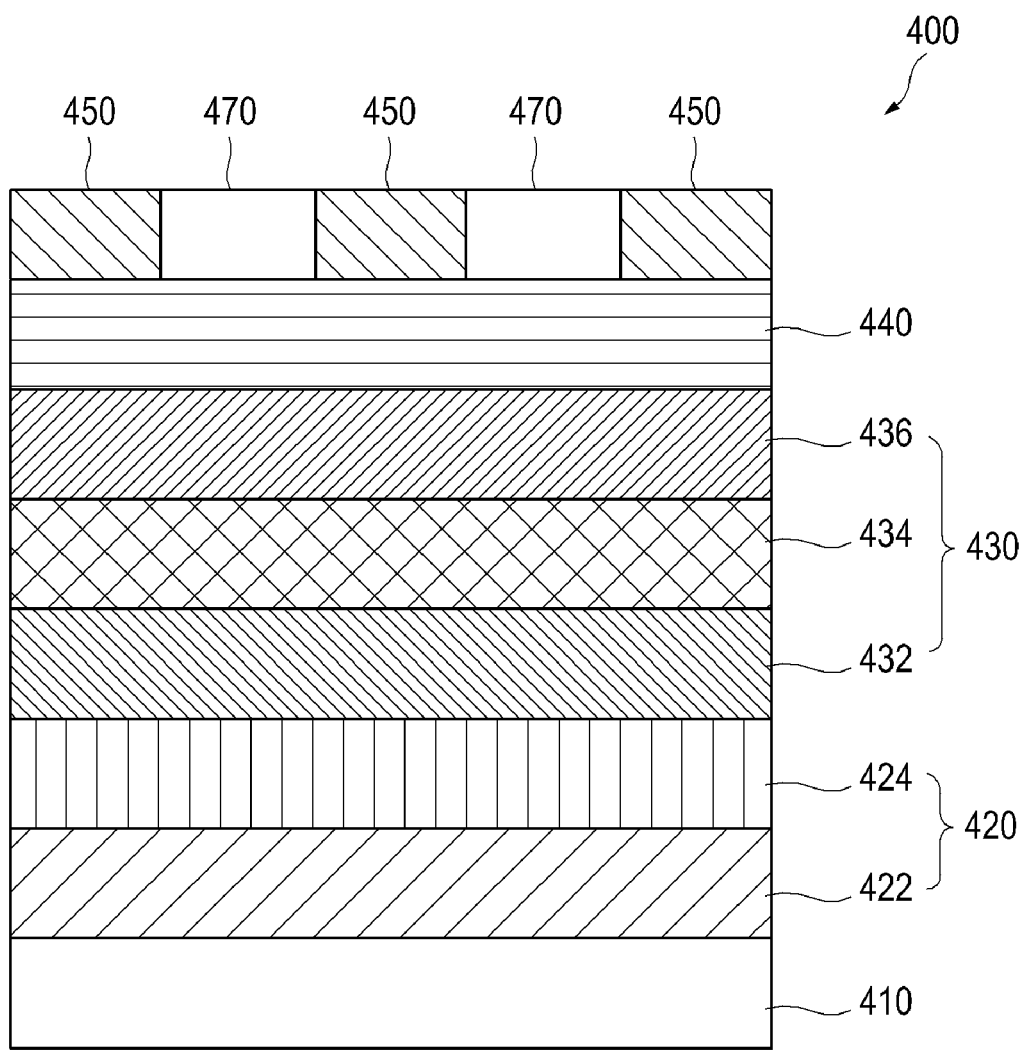
FIG. 8 shows a schematic diagram of yet another illustrative embodiment of a photovoltaic device.

FIG. 8 shows a schematic diagram of an illustrative embodiment of a photovoltaic device 400. As depicted, photovoltaic device 400 may have a structure similar to that of photovoltaic device 300 except for the presence of an active layer 430. Active layer 430 may include a first barrier layer 432, a second barrier layer 436, and a well layer 434 interposed between first barrier layer 432 and second barrier layer 436. Barrier layers 432, 436 may have a quaternary semiconductor to reduce strain and/or built-in field in well layer 434 as explained above regarding Equation 5. In one embodiment, active layer 430 may have characteristics such as composition, width, thickness, etc, similar to those of active layer 230 as shown in FIG. 4. In one embodiment, layers 410, 420, 422, 424, 440, 450, 470 in photovoltaic device 400 may have characteristics such as composition, width, thickness, etc, similar to those of layers 310, 320, 322, 324, 340, 350, 370 in photovoltaic device 300, respectively.

Figure 9:
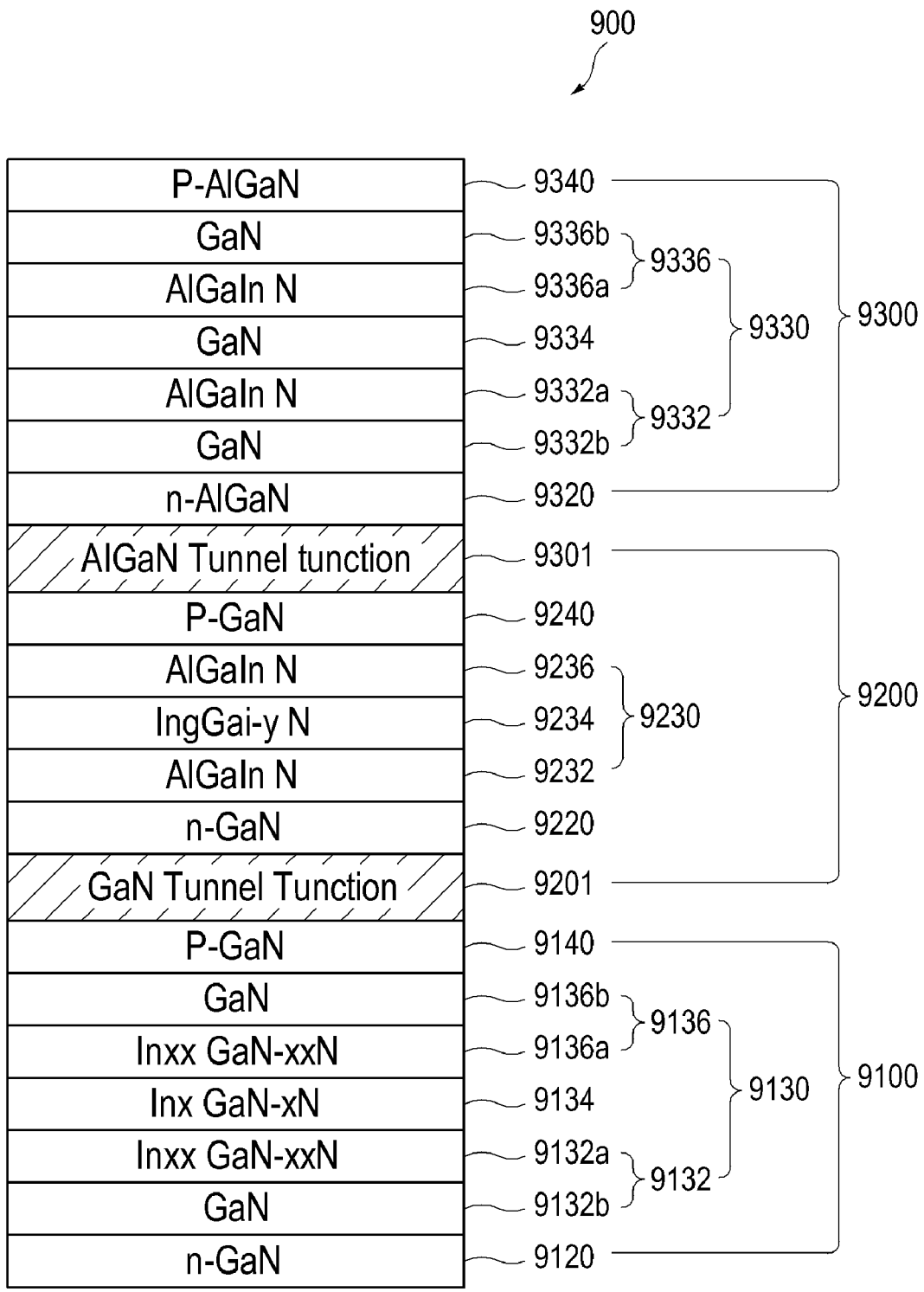
FIG. 9 shows an illustrative embodiment of a multiple well structure.

FIG. 9 shows a schematic diagram of an illustrative embodiment of a multiple well structure 900. As depicted, multiple well structure 900 may include a first well structure 9100, a second well structure 9200, and a third well structure 9300. Each of well structures 9100, 9200, 9300 may include first doped layers 9120, 9220, 9320, active layers 9130, 9230, 9330, and second doped layers 9140, 9240, 9340, respectively. Each of the active layers 9130, 9230, 9330 may include first barrier layers 9132, 9232, 9332, second barrier layers 9136, 9236, 9336 and well layers 9134, 9234, 9334 interposed between first barrier layers 9132, 9232, 9332 and second barrier layers 9136, 9236, 9336. Multiple well structure 900 may further include a first tunnel junction 9201 between first and second well structures 9100, 9200. Multiple well structure 900 may further include a second tunnel junction 9301 between second and third well structures 9200, 9300.

In one embodiment, well layer 9134 may include a nitride semiconductor represented by $In_xGa_{1-x}N$. Barrier layers 9132, 9136 may include sub barrier layers 9132a, 9136a including a composition represented by $In_{xx}Ga_{1-xx}N$ adjacent to well layer 9134 to reduce strain and/or the electric field in well layer 9134. Barrier layers 9132, 9136 may include primary barriers 9132b, 9136b including GaN. First doped layer 9120 may include an n-type GaN and second doped layer 9140 may include a p-type GaN.

In one embodiment, well layer 9234 may include a nitride semiconductor represented by $In_yGa_{1-y}N$. Barrier layers 9232, 9236 may include a quaternary nitride semiconductor represented by AlGaInN to reduce strain and/or the electric field in well layer 9234. First doped layer 9220 may include an n-type GaN and second doped layer 9240 may include a p-type GaN. First tunnel junction 9201 may include GaN.

In one embodiment, well layer 9334 may include a nitride semiconductor represented by GaN. Barrier layers 9332, 9336 may include sub barriers 9332a, 9336a including a composition represented by AlGaInN adjacent to well layer 9334 to reduce strain and/or the electric field in well layer 9334. Barrier layers 9332, 9336 may include primary barriers 9332b, 9336b including GaN. First doped layer 9320 may include n-type AlGaN and second doped layer 9340 may include p-type AlGaN. Second tunnel junction 9301 may include AlGaN.

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, reagents, compounds compositions or biological systems, which can, of course, vary. It is also to be understood that the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.).

It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," and the like include the number recited and refer to ranges which can be subsequently broken down into subranges as discussed above. Finally, as will be understood by one skilled in the art, a range includes each individual member. Thus, for example, a group having 1-3 cells refers to groups having 1, 2, or 3 cells. Similarly, a group having 1-5 cells refers to groups having 1, 2, 3, 4, or 5 cells, and so forth.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

The invention claimed is:

1. A device comprising:
    an active layer comprising:
        a first barrier layer;
        a well layer located on the first barrier layer and made of a nitride semiconductor; and
        a second barrier layer located on the well layer; and
    a metal layer located adjacent to and in direct contact with the first barrier layer, well layer and second barrier layer of the active layer,
    wherein at least one of the first barrier layer and the second barrier layer includes a quaternary nitride semiconductor.

2. The device of claim 1, further comprising:
    a first doped layer located beneath the first barrier layer; and
    a second doped layer located on the second barrier layer, wherein the metal layer is located on the first doped layer and laterally adjacent to the second doped layer.

3. The device of claim 1, wherein the metal layer is laterally adjacent to both sides of the active layer.

4. The device of claim 1, wherein the well layer comprises indium, gallium or nitrogen.

5. The device of claim 1, wherein the quaternary semiconductor comprises indium, gallium, nitrogen and aluminum.

6. The device of claim 1, wherein the metal layer comprises metal material selected from the group consisting essentially of Ag, Al, Au, Ni and Ti.

7. The device of claim 1, wherein the well layer has a valence band energy upper limit $Evw$ and a conduction band lower limit $Ecw$, and wherein at least one of:
    a first primary barrier layer of the first barrier layer has a valence band energy upper limit $Ev1b$ and a conduction band energy lower limit $Ec1b$, a first sub barrier layer of the first barrier layer is located adjacent to the well layer and has a valence band energy upper limit $Ev1a$ and a conduction band energy lower limit $Ec1a$, the valence band energy upper limits satisfy the relationship $Ev1b<Ev1a<Evw$, and the conduction band energy lower limits satisfy the relationship $Ec1b>Ec1a>Ecw$; or
    a second primary barrier layer of the second barrier layer has a valence band energy upper limit $Ev2b$ and a conduction band energy lower limit $Ec2b$, a second sub barrier layer of the second barrier layer is located adjacent to the well layer and has a valence band energy upper limit $Ev2a$ and a conduction band energy lower limit $Ec2a$, the valence band energy upper limits satisfy the relationship $Ev2b<Ev2a<Evw$, and the conduction band energy lower limits satisfy the relationship $Ec2b>Ec2a>Ecw$.

8. A device comprising:
    a first active layer comprising:
        a first barrier layer;
        a first well layer located on the first barrier layer, the first well layer made of a nitride semiconductor; and
        a second barrier layer located on the first well layer;
    a second active layer located on the first active layer, the second active layer comprising:
        a third barrier layer;
        a second well layer located on the third barrier layer, the second well layer made of a nitride semiconductor; and
        a fourth barrier layer located on the second well layer; and
    a metal layer located next to and in direct contact with at least the first barrier layer, first well layer and second barrier layer of the first active layer or the third barrier layer, second well layer and fourth barrier layer of the second active layer.

9. The device of claim 8, wherein at least one of the first barrier layer and the second barrier layer comprises a first sub barrier layer adjacent to the first well layer and the first sub barrier layer comprises material constituting the first well layer, or at least one of the third barrier layer and the fourth barrier layer comprises a second sub barrier layer adjacent to the second well layer and the second sub barrier layer comprises material constituting the second well layer.

10. The device of claim 8, wherein at least one of the first barrier layer, the second barrier layer, the third barrier layer, and the fourth barrier layer comprises a quaternary nitride semiconductor.

11. The device of claim 8, wherein the well layer has a valence band energy upper limit $Evw$ and a conduction band lower limit $Ecw$, and wherein at least one of:
    a first primary barrier layer of at least one of the first barrier layer and the second barrier layer has a valence band energy upper limit $Ev1b$ and a conduction band energy lower limit $Ec1b$, the first sub barrier layer has a valence band energy upper limit $Ev1a$ and a conduction band energy lower limit $Ec1a$, the valence band energy upper limits satisfy the relationship $Ev1b<Ev1a<Evw$, and the conduction band energy lower limits satisfy the relationship $Ec1b>Ec1a>Ecw$; or
    a second primary barrier layer of at least one of the third barrier layer and the fourth barrier layer has a valence band energy upper limit $Ev2b$ and a conduction band energy lower limit $Ec2b$, the second sub barrier layer has a valence band energy upper limit $Ev2a$ and a conduction band energy lower limit $Ec2a$, the valence band energy upper limits satisfy the relationship $Ev2b<Ev2a<Evw$, and the conduction band energy lower limits satisfy the relationship $Ec2b>Ec2a>Ecw$.

* * * * *